US008340337B2

(12) United States Patent
Jiang et al.

(10) Patent No.: US 8,340,337 B2
(45) Date of Patent: Dec. 25, 2012

(54) LOUDSPEAKER MODULE

(75) Inventors: Bin Jiang, Shenzhen (CN); Man-Zhong Wang, Shenzhen (CN); Te-Hua Lee, Taipei Hsien (TW)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 389 days.

(21) Appl. No.: 12/817,194

(22) Filed: Jun. 17, 2010

(65) Prior Publication Data

US 2011/0096946 A1 Apr. 28, 2011

(30) Foreign Application Priority Data

Oct. 22, 2009 (CN) .......................... 2009 1 0308626

(51) Int. Cl.

| | |
|---|---|
| ***H04R 1/02*** | (2006.01) |
| ***H04R 1/20*** | (2006.01) |
| ***H05K 5/02*** | (2006.01) |
| *H04R 1/00* | (2006.01) |
| *H05K 5/00* | (2006.01) |

(52) U.S. Cl. ........ 381/345; 381/349; 381/387; 181/156; 181/199; 181/148; 181/196; 181/197

(58) Field of Classification Search .................. 381/182, 381/345, 349, 161, 336, 305, 386, 387, 388, 381/333, 334, 335, 301, 300; 181/144, 153, 181/156, 160, 199, 148, 143, 196, 197
See application file for complete search history.

(56) References Cited

U.S. PATENT DOCUMENTS

| | | | | | |
|---|---|---|---|---|---|
| 1,568,589 | A | * | 1/1926 | Eddington | 381/418 |
| 2,618,352 | A | * | 11/1952 | Leslie | 181/143 |
| 2,622,692 | A | * | 12/1952 | Leslie | 181/143 |
| 2,790,164 | A | * | 4/1957 | Oberg | 340/388.1 |
| 2,869,669 | A | * | 1/1959 | Leslie | 181/143 |
| 3,122,215 | A | * | 2/1964 | Sutton | 181/160 |
| 3,174,579 | A | * | 3/1965 | Leslie | 181/143 |
| 3,888,333 | A | * | 6/1975 | Yamaguchi | 181/143 |
| 4,142,603 | A | * | 3/1979 | Johnson | 181/148 |
| 4,219,099 | A | * | 8/1980 | Sacks | 181/153 |
| 4,567,959 | A | * | 2/1986 | Prophit | 181/156 |
| 4,756,382 | A | * | 7/1988 | Hudson, III | 181/156 |
| 5,111,509 | A | * | 5/1992 | Takeuchi et al. | 381/338 |
| 5,170,435 | A | * | 12/1992 | Rosen et al. | 381/86 |
| 5,173,575 | A | * | 12/1992 | Furukawa | 381/96 |
| 5,191,177 | A | * | 3/1993 | Chi | 181/153 |
| 5,450,499 | A | * | 9/1995 | Morris et al. | 381/397 |
| 5,550,921 | A | * | 8/1996 | Freadman | 381/300 |
| 5,644,109 | A | * | 7/1997 | Newman | 181/156 |
| 5,664,020 | A | * | 9/1997 | Goldfarb et al. | 381/89 |
| 5,687,245 | A | * | 11/1997 | Boyden | 381/385 |
| 5,802,194 | A | * | 9/1998 | Yamagishi et al. | 381/386 |
| 5,825,900 | A | * | 10/1998 | Jeon | 381/339 |

(Continued)

*Primary Examiner* — Edgardo San Martin
(74) *Attorney, Agent, or Firm* — Altis Law Group, Inc.

(57) ABSTRACT

A loudspeaker module includes a hollow main body, two rotatable connecting portions, and two loudspeakers. The hollow main body includes two opposite sidewalls. Each of the opposite sidewall defines a first opening, an inner sidewall of the first opening defines an annular rotating slot. One end of the connecting portion extends an annular flange shaped corresponding to the rotating slot. The two rotatable connecting portions are respectively rotatably connected to the main body via the flange rotating about the rotating slot. Two loudspeakers are disposed in an end of the corresponding rotatable connecting portion away from the main body.

5 Claims, 4 Drawing Sheets

U.S. PATENT DOCUMENTS

| | | | | |
|---|---|---|---|---|
| 6,021,208 | A * | 2/2000 | Kin-Lung | 381/338 |
| 6,035,051 | A * | 3/2000 | Sato | 381/340 |
| 6,141,428 | A * | 10/2000 | Narus | 381/338 |
| 6,561,311 | B2 * | 5/2003 | Chuang | 181/199 |
| 7,130,440 | B2 * | 10/2006 | Maekawa et al. | 381/389 |
| 7,218,747 | B2 * | 5/2007 | Huffman | 381/345 |
| 7,252,175 | B2 * | 8/2007 | Suzuki | 181/156 |
| 7,410,029 | B2 * | 8/2008 | Tanaami | 181/156 |
| 7,870,928 | B1 * | 1/2011 | Jiang et al. | 181/148 |
| 2005/0072624 | A1 * | 4/2005 | Hwan Ryu et al. | 181/199 |
| 2005/0189164 | A1 * | 9/2005 | Chang | 181/152 |
| 2007/0215407 | A1 * | 9/2007 | Chiang | 181/156 |

* cited by examiner

LOUDSPEAKER MODULE

BACKGROUND

1. Technical Field

The present disclosure relates to a loudspeaker module.

2. Description of Related Art

Loudspeaker modules are mounted in some electronic devices, such as laptop computers, for emitting sound. Conventional loudspeaker modules typically include a speaker and a main body for receiving the speaker. However, the location of the speaker and output directions cannot change with respect to the main body, which is inconvenient.

Therefore, it is desirable to provide a loudspeaker module which can overcome the above-mentioned problems.

BRIEF DESCRIPTION OF THE DRAWINGS

Many aspects of the present loudspeaker module can be better understood with reference to the accompanying drawings. The components in the drawings are not necessarily drawn to scale, the emphasis instead being placed upon clearly illustrating the principles of the present loudspeaker module. Moreover, in the drawings, like reference numerals designate corresponding parts throughout the several views, and all the views are schematic.

DETAILED DESCRIPTION

Embodiments of the disclosure will now be described in detail below and with reference to the drawings.

Figure 1:
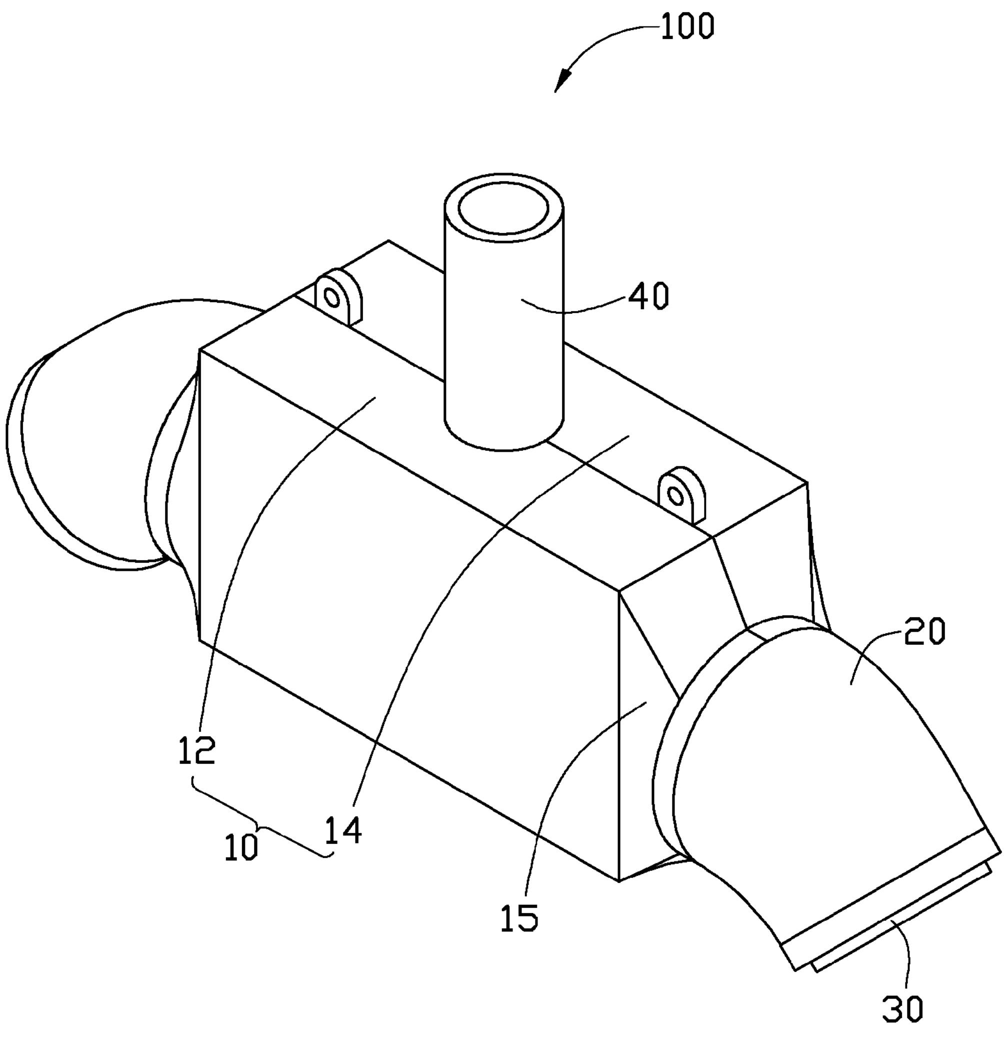
FIG. 1 is an assembled, isometric view of a loudspeaker module, according to an exemplary embodiment.

Referring to FIG. 1, a loudspeaker module 100, according to an exemplary embodiment, includes a hollow main body 10, two rotatable connecting portions 20 attached to the hollow main body 10, two loudspeakers 30 disposed in the corresponding rotatable connecting portions 20, and an inverter tube 40 adjustably connected to the main body 10. The interior spaces of the main body 10 and the inverter tube 40 are communicated with each other.

Figure 2:
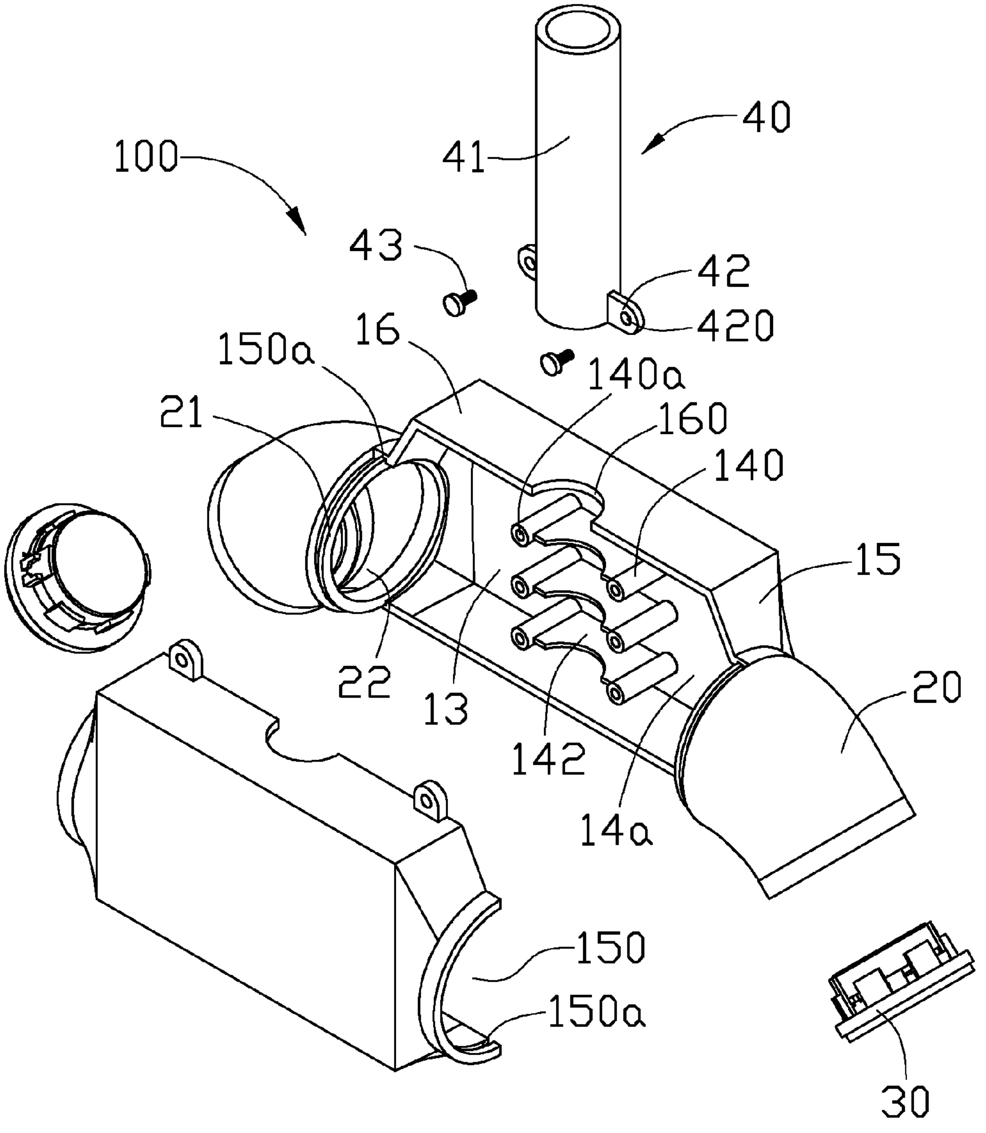
FIG. 2 is an exploded, isometric view of the loudspeaker module of FIG. 1.
Figure 3:
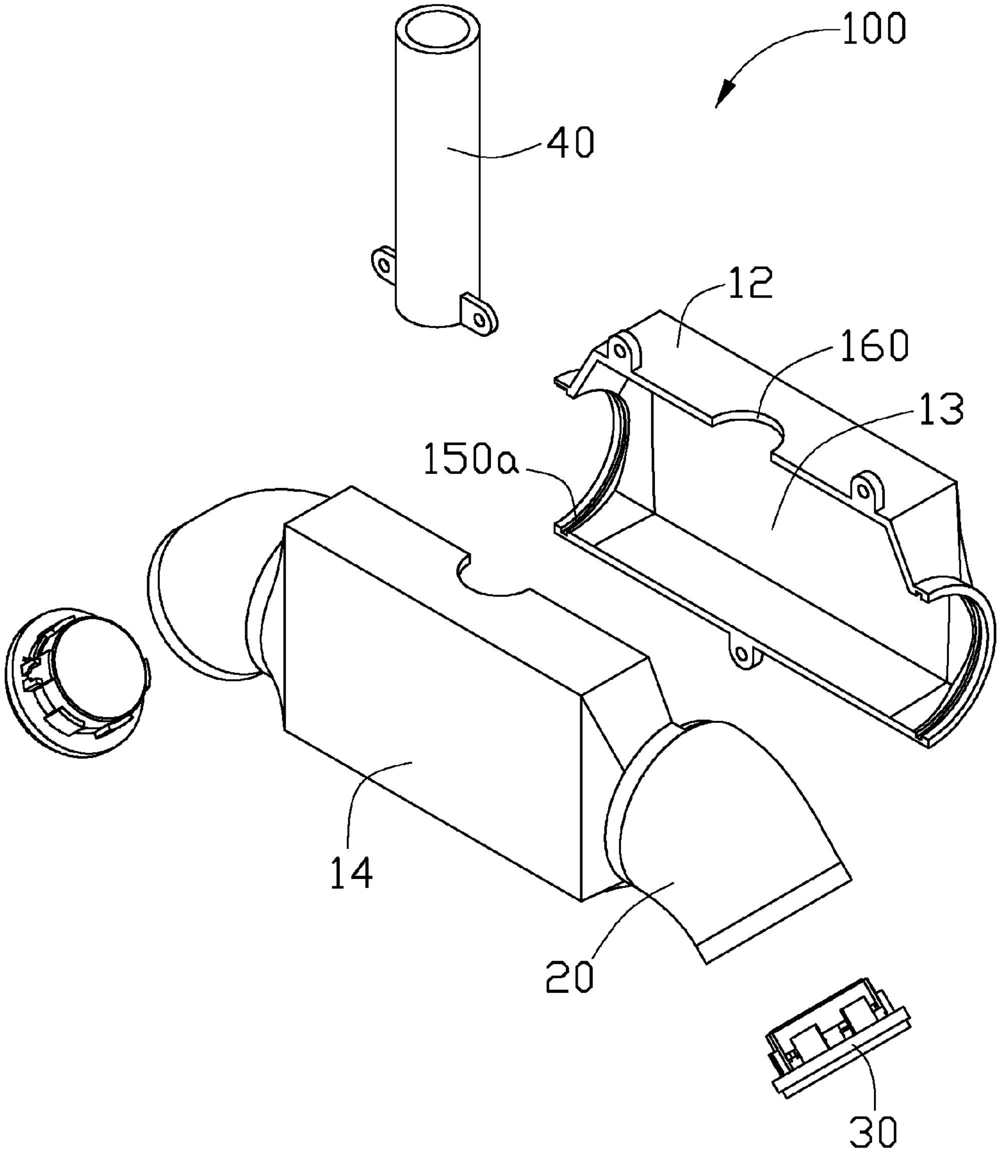
FIG. 3 is an exploded, isometric view of the loudspeaker module of FIG. 2, viewed from another angle.

Also referring to FIGS. 2-3, the hollow main body 10 is cubical in shape and includes a front cover 12 and a rear cover 14 latched to the front cover 12. The front cover 12 and the rear cover 14 cooperatively define a voice chamber 13. Both the front cover 12 and the rear cover 14 are rectangular in shape. The rear cover 14 includes an inner sidewall 14*a*. A plurality of pairs of fastener-receiving portions 140 which extend outward from the inner sidewall 14*a*. The plurality of pairs of the fastener-receiving portions 140 are disposed on the inner sidewall 14*a* in the order from the top to the bottom of the main body 10. Each pair of the fastener-receiving portions 140 is arranged along a line parallel to the lengthwise direction of the main body 10. A plurality of stabilization plates 142 are employed and each stabilization plate 142 connects two fastener-receiving portions 140 of the same pair. Each of the fastener-receiving portions 140 defines a first threaded hole 140*a*. In the present embodiment, the rear cover 14, the fastener-receiving portion 140, and the stabilization plates 142 are integrally formed as a one-piece element.

The main body 10 further includes two opposite sidewalls 15 and a top plate 16 substantially perpendicularly connected between the two opposite sidewalls 15. Each of the opposite sidewalls 15 defines a first opening 150. In the present embodiment, the first opening 150 is circular. The main body 10 defines an annular rotating slot 150*a* in the inner sidewall of the first opening 150. The top plate 16 defines a second opening 160. In the present embodiment, the second opening 160 is also circular.

Each of the connecting portions 20 is arc-shaped tubes. One end of the connecting portion 20 extends an annular flange 21 from the outer circumferential surface thereof and shaped corresponding to the rotating slot 150*a*. The two rotatable connecting portions 20 are rotatably connected to the main body 10 via the flange 21 being rotatably received in the rotating slot 150*a*. The interior space of the rotatable connecting portion 20 forms a voice passage 22 communicated with the voice chamber 13.

The loudspeaker 30 is an electroacoustic transducer that converts an electrical signal into sound. The two loudspeakers 30 are respectively disposed in a corresponding rotatable connecting portions 20.

The inverter tube 40 includes a hollow cylindrical tube 41 and two fixed portions 42 respectively formed on the outer sidewall of the hollow cylindrical tube 41. Each of the two fixed portions 42 defines a second threaded hole 420 corresponding to the first threaded hole 140*a*. Two fasteners 43 are employed to assemble the inverter tube 40 and the rear cover 14 together by threadedly inserting into the second threaded hole 420 and selectively inserting into the first threaded hole 140*a* of one pair of the fastener-receiving portions 140. One end of the inverter tube 40 is received in the voice chamber 13 of the main body 10 and the other end runs through the second opening 160. The length of the inverter tube 40 receiving in the voice chamber 13 can be changed according to the inverter tube 40 fixed to different pairs of fastener-receiving portions 140, thus changing the hollow volume of the voice chamber 13, to adjust the audio characteristics of the loudspeaker module 100. The inverter tube 40 is also configured for receiving sound waves generated by the loudspeaker 30 from the voice passage 22 to the voice chamber 13, then rotating acoustic phase 180° to transmit the inverted sound waves out of the main body 10, which increases the frequency of radiating energy.

Figure 4:
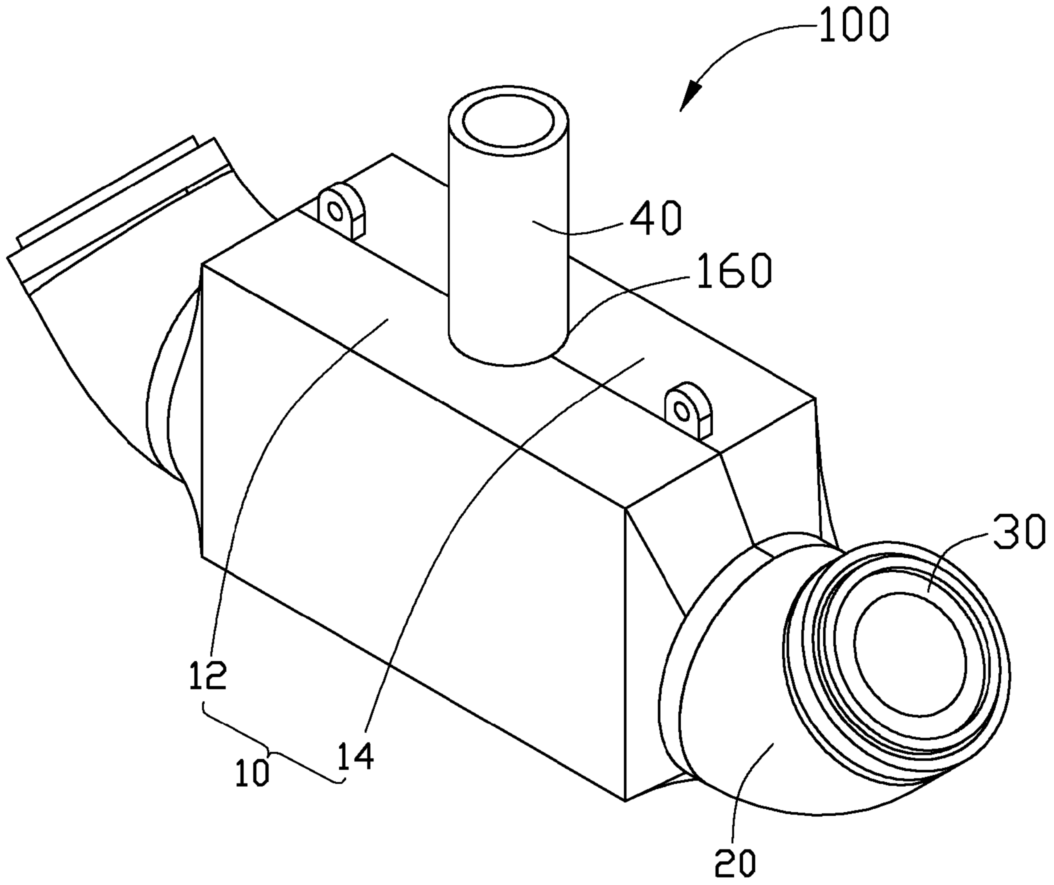
FIG. 4 is an isometric, schematic view of the loudspeaker module, which is in an operation mode, according to an exemplary embodiment.

Referring to FIGS. 1 and 4, in use, the location of the loudspeaker 30 is adjustable via the flange 21 rotating about the rotating slot 150*a*, which is convenient for assembling for different electronic devices. The two rotatable connecting portions 20 are operable to rotate the loudspeaker 30 relative to the main body 10, so as to change the location of the loudspeaker 30 with respect to the main body 10.

It will be understood that the above particular embodiments and methods are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A loudspeaker module comprising:

a hollow main body comprising two opposite sidewalls, each of the opposite sidewall defining a first opening, an inner sidewall of the first opening defining an annular rotating slot, the main body further comprising a front cover, a rear cover latched to the front cover, and a top plate substantially perpendicularly connected between the two opposite sidewalls, the front cover and the rear cover cooperatively defining a voice chamber, the top plate defining a second opening, the rear cover comprising an inner sidewall, a plurality of pairs of fastener-receiving portions extending outward from the inner sidewall of the rear cover, the plurality of pairs of fastener-receiving portions disposed on the inner sidewall in the order from the top to the bottom of the main body, each pair of fastener-receiving portions arranged along a line parallel to the lengthwise direction of the main body, each of the fastener-receiving portions defining a first threaded hole;

two rotatable connecting portions, one end of the connecting portion extending an annular flange corresponding to the rotating slot, the two rotatable connecting portions rotatably connected to the main body via the flanges received in the rotating slots;

two loudspeakers, each of the loudspeakers disposed in an end of the corresponding rotatable connecting portion; and a inverter tube, one end of the inverter tube is received in the voice chamber of the main body and the other end runs through the second opening, the inverter tube comprising a hollow cylindrical tube and two fixed portions respectively formed on the outer sidewall of the hollow cylindrical tube, each of the two fixed portions defining a second threaded hole corresponding to the first threaded hole, wherein two fasteners are employed to assemble the inverter tube and the rear cover together, the length of the inverter tube receiving in the voice chamber can be changed according to the inverter tube fixed on different pairs of fastener-receiving portions.

2. The loudspeaker module of claim 1, wherein each rotatable connecting portion is an arc-shaped tube, the inner of the rotatable connecting portion forms a voice passage communicated with the voice chamber.

3. The loudspeaker module of claim 1, wherein both the first and the second openings are circular.

4. The loudspeaker module of claim 1, wherein a plurality of stabilization plates are employed and each stabilization plate connects two fastener-receiving portions of the same pair.

5. The loudspeaker module of claim 4, wherein the rear cover, the fastener-receiving portion, and the stabilization plates are integrally formed as an one-piece element.

* * * * *